United States Patent
Shannon et al.

(10) Patent No.: US 7,838,430 B2
(45) Date of Patent: Nov. 23, 2010

(54) PLASMA CONTROL USING DUAL CATHODE FREQUENCY MIXING

(75) Inventors: Steven C. Shannon, San Mateo, CA (US); Dennis S. Grimard, Ann Arbor, MI (US); Theodoros Panagopoulos, Cupertino, CA (US); Daniel J. Hoffman, Saratoga, CA (US); Michael G. Chafin, Santa Clara, CA (US); Troy S. Detrick, Los Altos, CA (US); Alexander Paterson, San Jose, CA (US); Jingbao Liu, Sunnyvale, CA (US); Taeho Shin, San Jose, CA (US); Bryan Y. Pu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1259 days.

(21) Appl. No.: 10/823,364

(22) Filed: Apr. 12, 2004

(65) Prior Publication Data

US 2005/0090118 A1      Apr. 28, 2005

Related U.S. Application Data

(60) Provisional application No. 60/514,993, filed on Oct. 28, 2003.

(51) Int. Cl.
    *H01L 21/302*    (2006.01)
(52) U.S. Cl. .................. 438/706; 438/689; 438/702; 438/709; 438/710; 216/37; 216/67
(58) Field of Classification Search .............. 438/689, 438/702, 709, 710; 216/37, 67
    See application file for complete search history.

(56) References Cited

U.S. PATENT DOCUMENTS

| | | |
|---|---|---|
| 4,579,618 A | 4/1986 | Celestino et al. |
| 4,585,516 A | 4/1986 | Corn et al. |
| 4,863,549 A | 9/1989 | Grunwald |
| 5,512,130 A | 4/1996 | Barna et al. |
| 5,556,501 A | 9/1996 | Collins et al. |
| 5,817,534 A | 10/1998 | Ye et al. |

(Continued)

FOREIGN PATENT DOCUMENTS

| | | |
|---|---|---|
| EP | 0553704 | 8/1993 |
| JP | 2003-073836 | 3/2003 |
| WO | WO 03-043061 | 5/2003 |

OTHER PUBLICATIONS

Lieberman et al. (Plasma Sources Sci. Technol., 11 (2002) pp. 283-293).*
Georgieva et al. (Journal of Applied Physics, V. 94, No. 6, Sep. 15, 2003, pp. 3748-3756).*
U.S. Appl. No. 11/060,980, filed Feb. 18, 2005, Paterson, et al.
First Office Action from the State Intellectual Property Office (SIPO) of the P.R.C. received Jun. 21, 2010 for P.R.C. Patent Application No. 200710140633.2.

(Continued)

*Primary Examiner*—Lan Vinh
*Assistant Examiner*—Maki A Angadi
(74) *Attorney, Agent, or Firm*—Alan Taboada; Moser IP Law Group

(57) ABSTRACT

A method and apparatus for controlling characteristics of a plasma in a semiconductor substrate processing chamber using a dual frequency RF source is provided. The method comprises supplying a first RF signal to a first electrode disposed in a processing chamber, and supplying a second RF signal to the first electrode, wherein an interaction between the first and second RF signals is used to control at least one characteristic of a plasma formed in the processing chamber.

27 Claims, 5 Drawing Sheets

U.S. PATENT DOCUMENTS

| | | | |
|---|---|---|---|
| 5,985,375 A | 11/1999 | Donohoe et al. | |
| 6,089,181 A | 7/2000 | Inazawa et al. | |
| 6,110,287 A | 8/2000 | Arai et al. | |
| 6,113,731 A | 9/2000 | Shan et al. | |
| 6,126,778 A | 10/2000 | Donohoe et al. | |
| 6,190,496 B1 | 2/2001 | DeOrnellas et al. | |
| 6,193,855 B1 | 2/2001 | Gopalraja et al. | |
| 6,309,978 B1 | 10/2001 | Donohoe et al. | |
| 6,312,556 B1 | 11/2001 | Donohoe et al. | |
| 6,354,240 B1 | 3/2002 | DeOrnellas et al. | |
| 6,642,149 B2 | 11/2003 | Suemasa et al. | |
| 6,841,943 B2 | 1/2005 | Vahedi et al. | |
| 2002/0039626 A1 | 4/2002 | Nakahigashi et al. | |
| 2002/0041160 A1 | 4/2002 | Barnes et al. | |
| 2003/0127319 A1* | 7/2003 | Demaray et al. | 204/192.26 |
| 2003/0148611 A1* | 8/2003 | Dhindsa et al. | 438/689 |

* cited by examiner

US 7,838,430 B2

PLASMA CONTROL USING DUAL CATHODE FREQUENCY MIXING

CROSS-REFERENCE TO RELATED APPLICATIONS

This application claims the benefit of U.S. Provisional Application No. 60/514,993 filed Oct. 28, 2003, which is hereby incorporated by reference in its entirety.

BACKGROUND OF THE INVENTION

1. Field of the Invention

The present invention generally relates to plasma control in a semiconductor substrate processing system and, more particularly, to plasma control using a dual cathode frequency mixing technique.

2. Description of the Related Art

The increase in size of plasma enhanced semiconductor processing chambers contributes to a spatially variant effect over the surface of the substrate being processed. That is, as the size of the substrate being processed approaches the wavelength of the frequency that is used to bias the substrate, a spatial variation in the RF power distribution forms over the surface of the substrate (e.g., proximate the cathode that forms an electrode). This spatial variation can be frequency dependent in the regime of higher frequencies (shorter wavelengths), larger substrates, or combinations of the two. This spatially variant effect has a negative impact on process uniformity. For example, in an etch reactor, the standing wave effect can cause non-uniformity in the etched substrate surface.

Therefore, there is a need for an improved method and apparatus for semiconductor substrate processing that combats this spatially variant effect.

SUMMARY OF THE INVENTION

The present invention is a method and apparatus for controlling characteristics of a plasma in a plasma enhanced semiconductor substrate processing chamber. The method comprises supplying a first RF signal to a first electrode disposed in a processing chamber, and supplying a second RF signal to the first electrode, wherein an interaction between the first and second RF signals is used to control at least one characteristic of a plasma formed in the processing chamber.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

The present invention generally relates to semiconductor substrate processing in plasma enhanced processing chambers. More specifically, the present invention is a method and apparatus for controlling the characteristics of a plasma formed in a plasma enhanced processing chamber. Characteristics of the plasma which may be controlled include, but are not limited to, the power distribution within the plasma, and the ion energy distribution within the plasma and incident on the workpiece. These plasma characteristics may be controlled via a dual frequency cathode with ratio control in a plasma enhanced processing chamber.

Examples of plasma enhanced semiconductor processing chambers that may be adapted to benefit from the present invention include the eMax™, MXP®, and ENABLER™ processing chambers, all available from Applied Materials, Inc. of Santa Clara, Calif. The eMax™ processing chamber is described in U.S. Pat. No. 6,113,731, issued Sep. 5, 2000 to Shan et al. The MXP® processing chamber is described in U.S. Pat. No. 5,534,108, issued Jul. 9, 1996 to Qian et al., and U.S. Pat. No. 5,674,321, issued Oct. 7, 1997 to Pu et al. The ENABLER™ processing chamber is described in U.S. patent application Ser. No. 10/192,271, filed on Jul. 9, 2002. Each of these above-mentioned patents are hereby incorporated by reference in their entireties.

Figure 1:
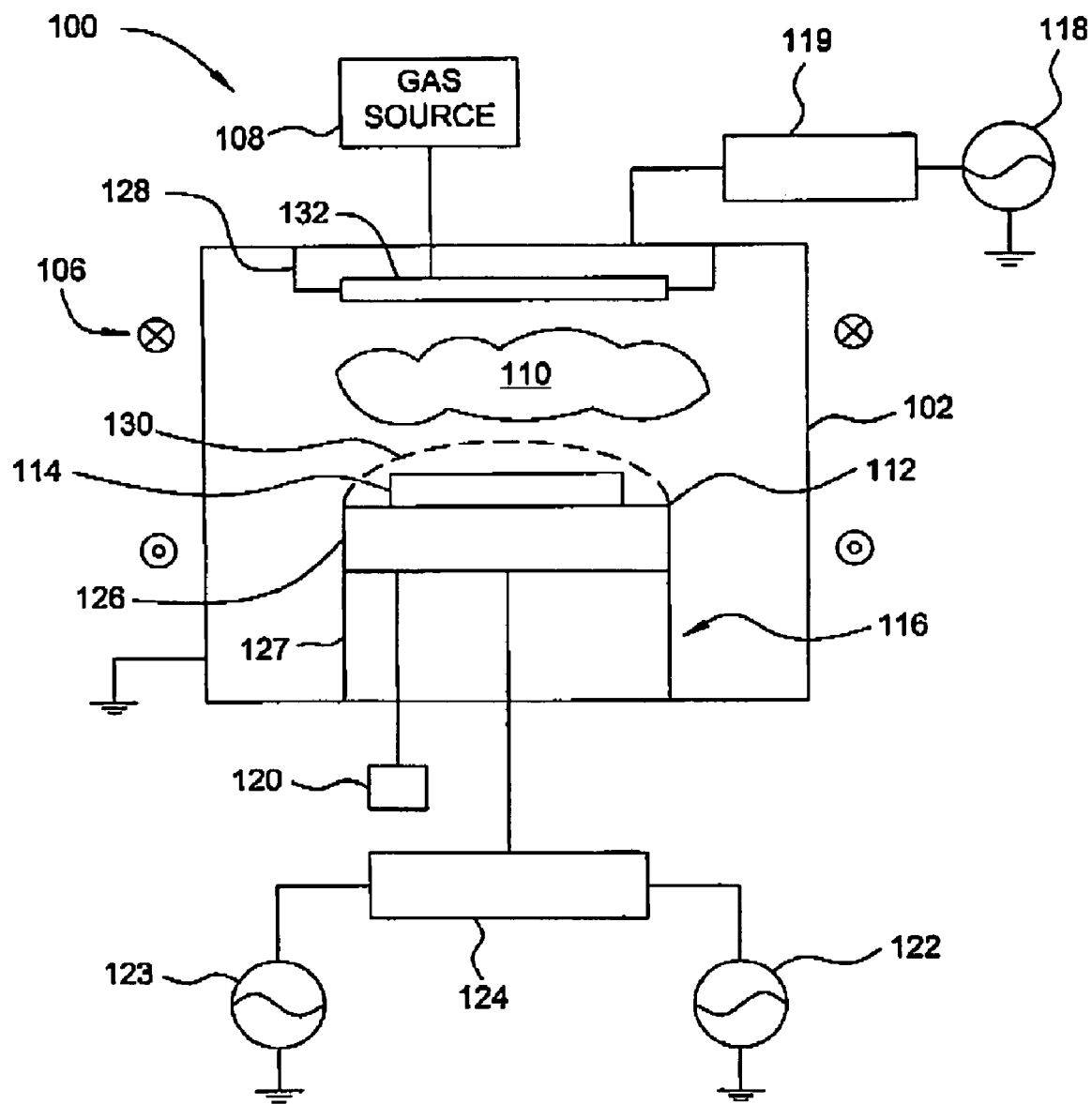
FIG. 1 is a partial schematic, cross-sectional view of a plasma enhanced processing chamber useful for practicing the present invention.

FIG. 1 depicts a partial schematic, cross-section view of a plasma enhanced processing chamber 100 useful for practicing the present invention. In one embodiment, a process chamber 100 includes a grounded chamber body 102 and at least one coil segment 106 disposed proximate to the exterior of the chamber body 102. The process chamber 100 also includes a wafer support pedestal 116 disposed within the chamber body 102 and spaced apart from a gas inlet 132. The wafer support pedestal 116 comprises a cathode 127 and an electrostatic chuck 126 for retaining a substrate 114 beneath the gas inlet 132.

The electrostatic chuck 126 is driven by a DC power supply 120 to develop an electrostatic force that holds the substrate on the chuck surface. The cathode 127 is coupled to a pair of RF bias sources 122, 123 through a matching network 124. The bias sources 122, 123 are generally capable of producing an RF signal having a frequency of from about 50 kHz to about 100 MHz and a power of between about 0 and about 10,000 Watts. The matching network 124 matches the impedance of the sources 122, 123 to the plasma impedance. A single feed couples energy from both sources 122, 123 to the support pedestal 116. Alternatively, each source 122, 123 can be coupled to the cathode 127 via a separate feed.

The gas inlet 132 may comprise one or more nozzles or a showerhead. The gas inlet 132 may comprise a plurality of gas distribution zones such that various gases provided from a gas source 108—which, when ignited, form a plasma 110—can be supplied to the chamber body 102 using a specific gas distribution gradient. The gas inlet 132 may form an upper electrode 128 that opposes the support pedestal 116. The upper electrode 128 can be coupled to an RF source 118 through a matching network 119, terminated to a specific impedance, or grounded. The source 118 is generally capable of producing an RF signal having a frequency in the about 10 Mhz to about 3 GHz range and a power between about 0 and 10,000 Watts. In one embodiment, the source 118 is capable of producing an RF signal having a frequency of about 60 MHz. The RF energy supplied by the source is generally used to facilitate dissociation and ionization of gases in the plasma.

In operation, a substrate 114 is disposed in the processing chamber 100 and held to the support pedestal 116 by the electrostatic chuck 126. A process gas is introduced into the chamber body 102 through the gas inlet 132 by the gas source 108. A vacuum pump, not shown, maintains the pressure inside the chamber body 102 at operating pressures—typically between about 10 mTorr to about 20 Torr.

In one embodiment, the RF source 118 provides about 1000 Watts of RF voltage at 13.56 MHz to the upper electrode 128, thereby exciting the gas inside the chamber body 102 and forming a plasma 110. The RF source 122 is selected to generate power at a frequency of about 2 MHz and the RF source 123 is selected to generate power at a frequency of about 13.56 MHz. The RF sources 122, 123 provide up to about 10,000 Watts of total RF power in a predetermined power ratio from the source 122 to the source 123 of between 1:0 and 0:1. These RF sources 122, 123 provide bias power that both self-biases the substrate and modulates the plasma sheath. Adjusting the ratio between the source 122 and 123 controls the characteristics of the plasma as defined below. The plasma, having a characteristic defined by the power ratio of the bias sources, facilitates etching one or more materials on the surface of the substrate. After a period of time, or the detection of a specific endpoint, the plasma is extinguished.

Control of Ion Energy Distribution within the Plasma

Figure 2:
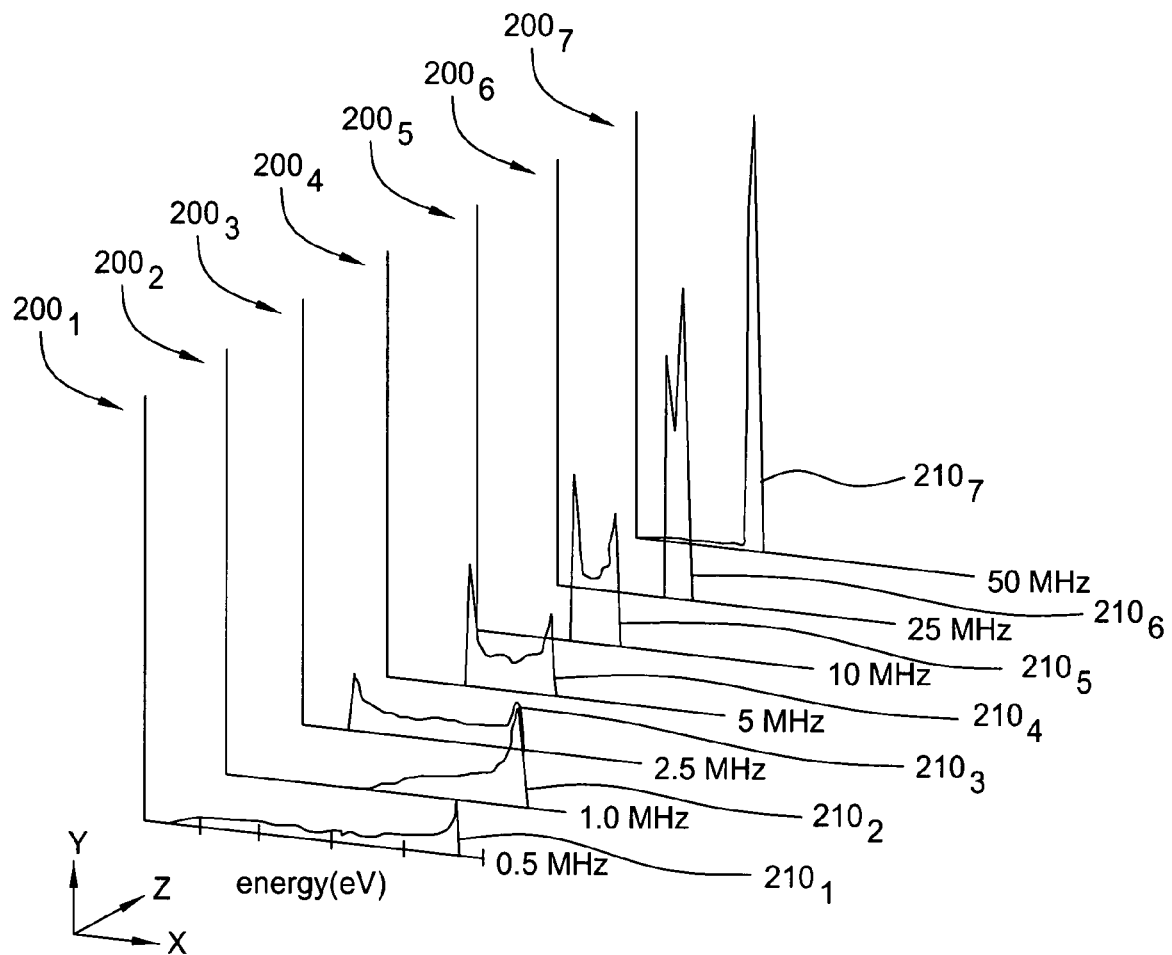
FIG. 2 is a graph of known ion energy distributions as a function of drive frequency.

The frequency dependence of ion energy distribution within a plasma chamber is well known. FIG. 2, taken from IEEE Trans. Plasma Sci., Vol. 19, No. 2, page 242, depicts a series of graphs $200_{1-7}$ of histograms (along the Y axes) of known ion energy distributions (along the X axes) as a function of drive frequencies (along the Z axis). As can be seen in the graphs $200_{1-7}$, the ion energy distribution associated with lower frequencies has a broader energy bandwidth (e.g., distribution $210_1$ in graph $200_1$), while higher frequencies have a progressively much more concentrated energy bandwidth (e.g., distribution $210_7$ in graph $200_7$). The relationship is generally continuous along the spectrum moving from the low frequency ion energy distribution to the high frequency ion energy distribution (e.g., compare distributions $210_{1-7}$ from graphs $200_{1-7}$).

Referring back to FIG. 1, in one embodiment, the invention comprises a dual frequency electrode (cathode 127) for use in a plasma enhanced processing chamber 100 as described above. The two frequencies on the cathode 127 are generally selected for the purpose of sheath modulation and are selected such that they are of a low enough frequency so as to provide a strong self-biasing sheath in the plasma discharge above the powered surface.

The first frequency provides a broad ion energy distribution (i.e., lower frequency). The second frequency provides a peaked, well defined ion energy distribution (i.e., higher frequency). Typically, the first frequency is selected such that it's cycle time is much larger than the transit time of an ion in the sheath, while the second frequency is selected such that it's period approaches or surpasses the transit time of the ion in the sheath. These frequencies are also selected such that when used in conjunction with a third power source provided by an independently driven electrode (e.g., the electrode 128 referred to in FIG. 1), they are not the primary power contributor for plasma ionization and dissociation.

The combined applied voltage of the two frequency sources is used to control the peak-to-peak sheath voltage as well as the self-biased DC potential that is used for anisotropic etching. The mixing of the two frequencies is used to tune the energy distribution about this average acceleration generated by this DC potential. Thus, utilizing a plasma enhanced processing chamber with a dual frequency cathode as described above, the ion energy distribution within the plasma can be controlled.

To understand how this ion energy distribution tuning works, consider a simple sheath model based on the RF current driven through a cylindrical plasma discharge. The thickness of the plasma sheath generated will oscillate linearly with the applied current:

$$s(t) = \bar{s} - s_0 \sin(\omega t) \tag{1}$$

where s is the thickness of the sheath, $\bar{s}$ is the average thickness over time, and $s_0$ is the amplitude of modulation generated by the RF power delivery at frequency $\omega/2\pi$.

If multiple frequencies are applied, the effect on the sheath thickness is additive, yielding:

$$s(t) = \bar{s} - s_{0_{xMHz}} \sin(\omega_x t) - s_{0_{yMHz}} \sin(\omega_y t) \tag{2}$$

where the subscripts x and y refer to the first and second RF sources respectively.

Assuming a symmetric discharge (just for simplicity of discussion; a similar case will hold true for asymmetric discharges as well), the sheath modulation can be related to applied RF current by the relationship:

$$\bar{s} = s_{0_{xMHz}} + s_{0_{yMHz}} \tag{3}$$

$$s_{0_{xMHz}} = \frac{I_{xMHz}}{en\omega_x A} \tag{4}$$

$$s_{0_{yMHz}} = \frac{I_{yMHz}}{en\omega_y A} \tag{5}$$

where I is the current amplitude at the stated frequency; e is the electron charge; n is the electron density of the bulk plasma; and A is the area of the powered surface (electrode).

The voltage across the sheath is related to this sheath modulation by the equation:

$$V_{sheath}(t) = -\frac{en}{2\varepsilon_0} s(t)^2 \tag{6}$$

where $\varepsilon_0$ is the permittivity of free space.

The acceleration of the ions and electrons can then be solved using a system of differential equations based on charged particle motion in an electromagnetic field:

$$\text{ions: } \frac{d^2 x}{dt^2} = \frac{e}{M_{ion}(s_{xMHz} + s_{yMHz})^2} V(t) x = 0 \tag{7}$$

$$\text{electrons: } \frac{d^2 x}{dt^2} = \frac{-e}{M_e(s_{xMHz} + s_{yMHz})^2} V(t) x = 0 \tag{8}$$

where $M_{ion}$ and $m_e$ are the masses of an ion and an electron, respectively, and with boundary conditions stating that the net charge on the electrode surface over an RF cycle is zero and that the initial velocity of the ion before it enters the sheath is equal to the Bohm velocity of the ion. Solving for this system of equations for ion velocity at the electrode surface provides a measure of ion energy distribution.

In order to physically assess the ability to control the ion energy distribution of the plasma in operation, the expected ion energy distribution in a plasma formed under a range of operating conditions was modeled and experimentally verified. The ion energy distribution was estimated by studying the on-wafer voltage on a wafer under various process conditions in an eMax™ processing chamber outfitted with a dual frequency cathode as described above with reference to FIG. 1. During this analysis, the two fundamental components of the plasma relative to it's interaction with the powered electrode (sheath peak-to-peak voltage and bulk electron density) were held constant and the ratios of applied currents (i.e., proportional to the applied power) of the two RF bias sources were varied while feeding a constant total power to the cathode. The first RF source 122 was tuned to 13.56 MHz and the second RF source 123 was tuned to 2 MHz.

Figure 3:
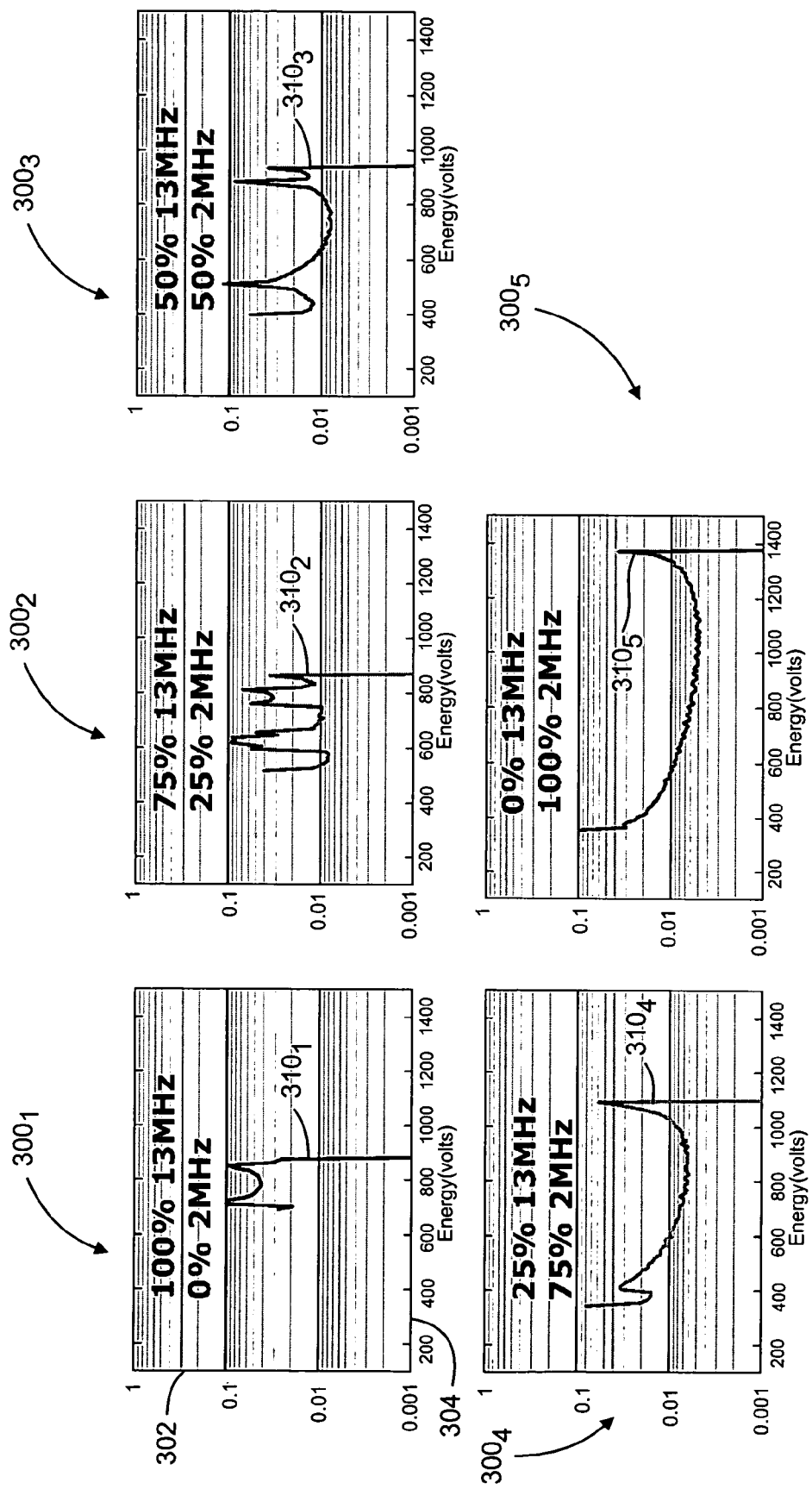
FIG. 3 is a series of graphs depicting ion energy distribution at various RF current ratios.

FIG. 3 is a series of graphs $300_{1-5}$ of this analysis, illustrating the results of varying the ratio of the applied currents of the two RF sources. The graphs show a distribution (axis 302) of the energy (axis 304) measured on the wafer. As can be seen from the graph $300_5$, labeled 0% 13 MHz, 100% 2 MHz, if the cathode is only driven with the low frequency RF source, an ion energy distribution $310_5$ which is very broad is obtained. This result is similar to the low frequency ion energy distributions depicted in FIG. 2 (see, e.g., distribution $210_1$ in graph $200_1$). The graph $300_1$, labeled 100% 13 MHz, 0% 2 MHz, on the other hand, shows a narrow energy distribution $310_1$ similar to the high frequency ion energy distributions depicted in FIG. 2 (see, e.g., distributions $210_5$ and $210_6$ in graphs $200_{5-6}$) when only the high frequency RF source is used.

However, the remaining graphs depicting other ratios where both the high and the low RF frequencies were mixed together reveal an important result. These graphs show the exact same trend as if individual intermediate frequencies were selected, as can be seen by comparison of the graphs $300_{1-5}$ to the histograms depicted in the graphs $200_{1-7}$ of FIG. 2. This shows how a desired distribution along a continuum of individual low to high frequency RF sources may be obtained by utilizing only two sources, rather than many sources. This result increases the capability to perform more processes in one chamber, i.e., increases the "process window" of the chamber.

Although the foregoing discussion focused only on modulating sheath properties with the dual frequency cathode drive, the principles discussed herein could be applied for dissociation as well. This would eliminate the need for the upper RF source for dissociation (RF source 118 in FIG. 1).

Furthermore, the chosen frequencies of 2 MHz and 13.56 MHz are illustrative only and not intended to define limitations of the invention. Both higher and lower frequencies can be utilized in the current invention.

Control of Power Distribution within the Plasma

In another embodiment, the power distribution within the plasma can be controlled utilizing a plasma enhanced processing chamber with a dual frequency cathode as described above with reference to FIG. 1. In this embodiment, two frequencies that provide similar plasma excitation properties but with different spatial uniformity profiles are combined to tune the uniformity of a process. For example, in the process chamber 100 depicted in FIG. 1, the cathode 127 forms a radial transmission line which is terminated along an outer perimeter 112 of the electrostatic chuck 126. This contributes to the creation of a spatially variant power distribution, illustratively shown as a dashed line 130 (it should be noted that the standing wave could be the inverse of the one shown as well). The spatially variant power distribution affects the power distribution in the plasma 110, resulting in greater power near the peak of the wave (near the center of the substrate 114 for the wave 130 depicted in FIG. 1) and lesser power in the trough (near the edge of the substrate 114 in FIG. 1). This power differential in the plasma affects the uniformity of the process being performed on the substrate. As such, in an etch reaction, the uniformity of an etched wafer would be negatively impacted.

Figure 4:
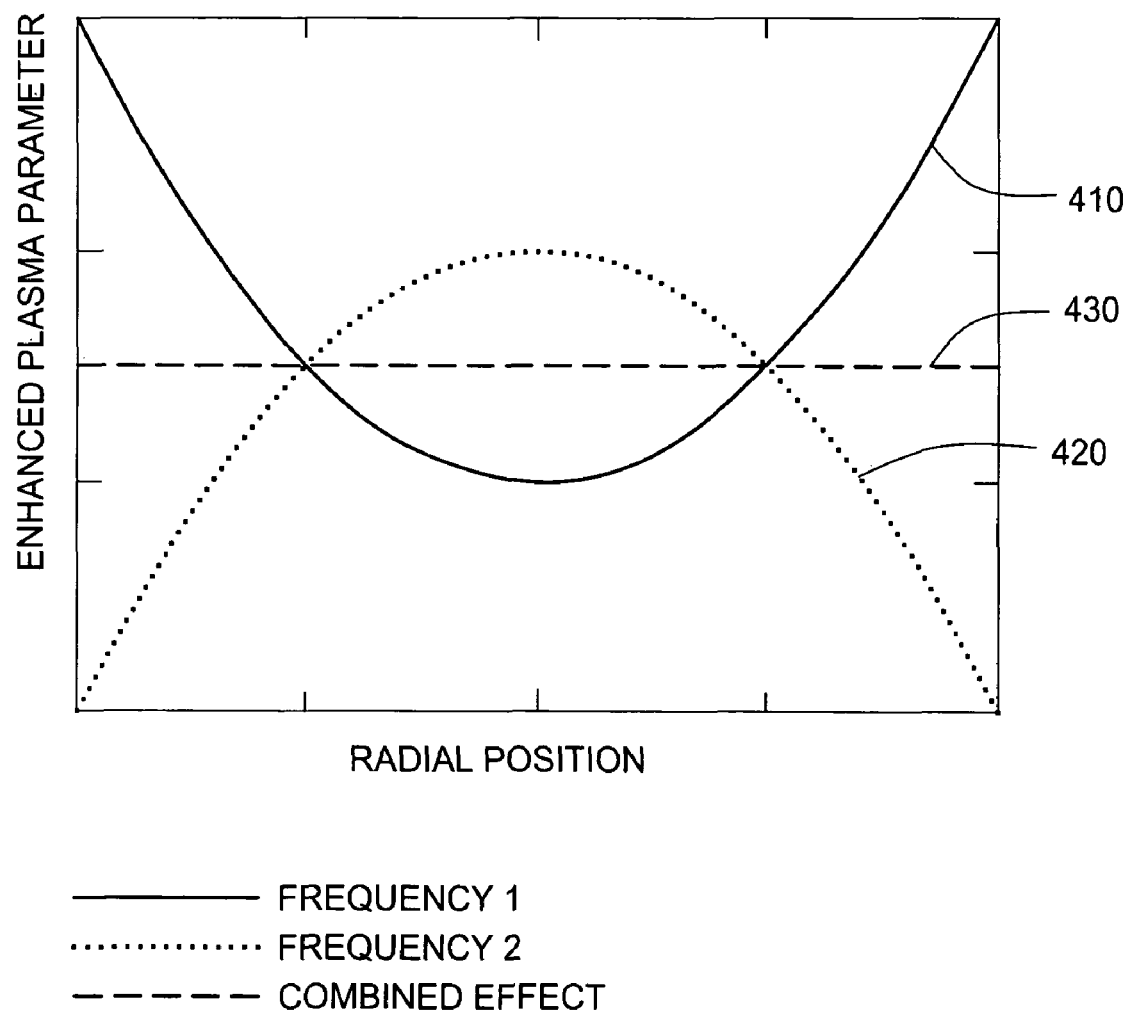
FIG. 4 is an illustrative schematic graph depicting the effect of multi-frequency mixing.

However, since the spatially variant power effect described above varies at different frequencies, two RF sources with different frequencies may be mixed together to drive the cathode 127 such that their respective standing waves substantially cancel each other. This is illustratively depicted in FIG. 4, which shows two opposing power distribution profiles 410, 420 centered over a substrate yielding a flat combined effect 430. It should also be noted that any other final power distribution profile that may prove beneficial to a certain process can also be formed using this method. (For example, in some CVD processes, an edge high power deposition profile is preferred to minimize the impact of non-azimuthally symmetric deposition in high-aspect ratio features on a processed workpiece).

This frequency mixing phenomenon may be used to control the power distribution in the plasma and thereby control uniformity of a desired process, such as etching. For example, to measure the effect of dual frequency tuning on process uniformity, an oxide layer and a photoresist layer on multiple wafers were etched using different cathode frequency ratios in an eMax™ processing chamber outfitted with a dual frequency cathode as described above with reference to FIG. 1. The first RF source was tuned to 13.56 MHz and the second RF source was tuned to 2 MHz. In each of these etch processes, the ratios of applied currents of the two RF drives were varied while keeping the total power to the cathode constant at 2,500 Watts. The oxide and photoresist etch rates were measured as well as the uniformity of each layer.

Figure 5:
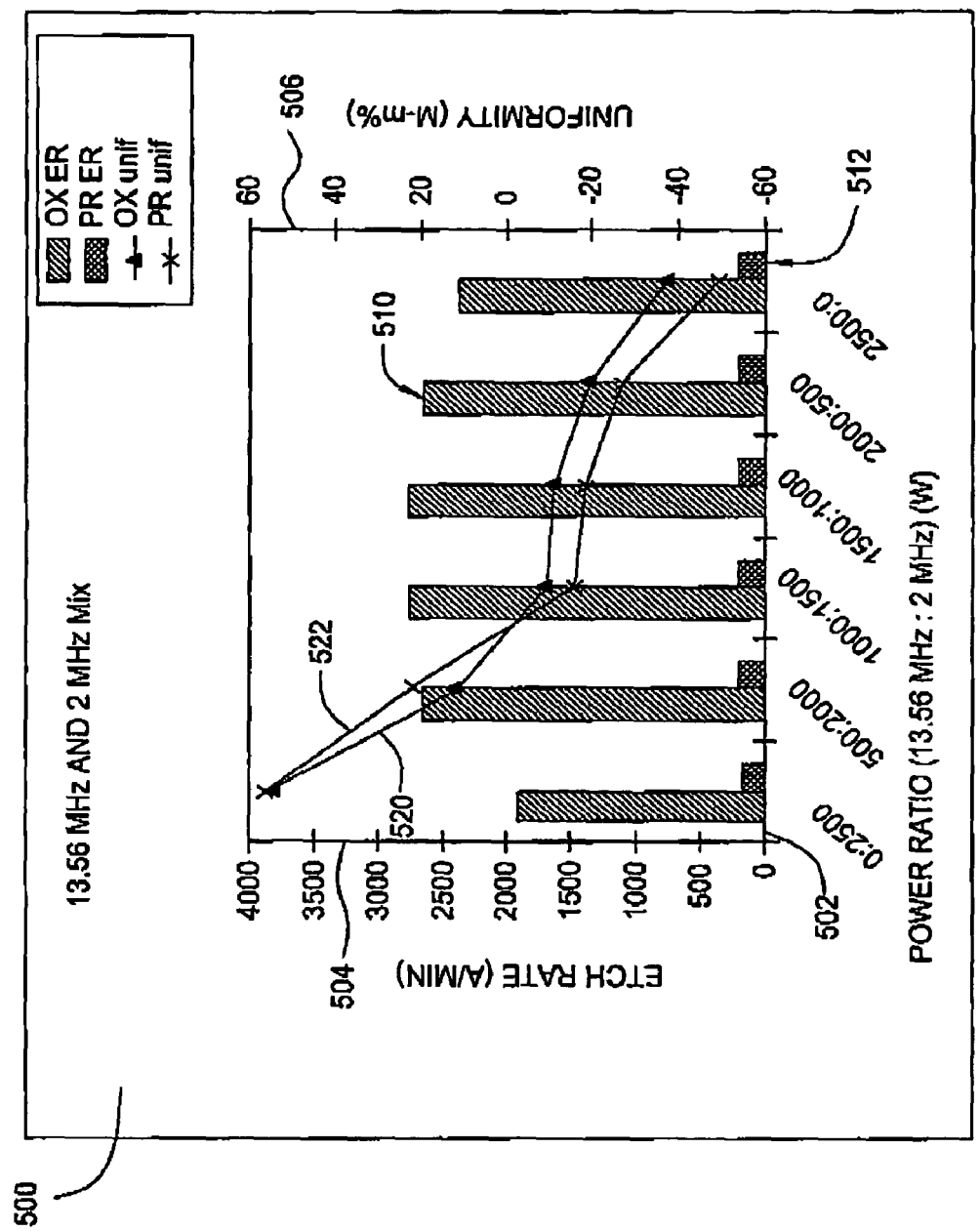
FIG. 5 is a graph depicting improvement in uniformity realized using the frequency mixing principles of the present invention.

FIG. 5 depicts a combined bar graph and line graph 500 depicting the etch rates and wafer uniformity for the processes described above. The x-axis 502 of the graph depicts the ratio of the power supplied by the 13.56 Mhz source to the power supplied by the 2 Mhz source. (For example 0:2500 means 0 W of the 13.56 MHz source and 2,500 W of the 2 MHz source.) As can be seen from the bars 510 labeled OX ER (oxide etch rate) and the bars 512 labeled PR ER (photoresist etch rate), the etch rate (axis 504) remains relatively constant regardless of the mix of power levels at the different frequencies.

However, the wafer uniformity (axis 506) for both the oxide and the photoresist (respectively shown as line 520, labeled "OX unif," and line 522, labeled PR unif," in FIG. 5) varied substantially over the power ratio mix. The uniformity ranged somewhat linearly from about 60% (indicating center-fast etching) at 0 W 13.56 MHz and 2500 W 2 MHz, to about −50% (indicating edge-fast etching) at 2500 W 13.56 MHz and 0 W 2 MHz, and near 0% with a fairly even ratio of the power of two frequencies. These results show that uniformity on an etched surface can be controlled fairly independently of the etch rate by controlling the power ratio of each frequency applied to a dual frequency cathode.

As mentioned above, the principles discussed herein apply to dissociation or ionization of bulk plasma, as well as modulation of the sheath properties of the plasma. Also, the chosen frequencies of 2 MHz and 13.56 MHz are illustrative only and not intended to define limitations of the invention. Both higher and lower frequencies may be utilized in the current invention. For example, drive frequencies may be grouped by their effect on the plasma, then selected as necessary to control the desired property. For example, high frequencies effect ionization and dissociation, while lower frequencies effect sheath modulation. Furthermore, the principles disclosed herein are not limited to control of standing waves. Additional reasons for frequency dependent propagation exist. For example, providing a frequency dependent termination to the transmission line, or a frequency dependent return path to ground in the chamber that can direct the RF waveform dependent upon its frequency.

Thus, a method and apparatus for controlling characteristics of a plasma in a plasma enhanced processing chamber using a dual frequency cathode drive has been provided. The mixing of the two frequencies driving the cathode controls the ion energy and power distributions of a plasma.

While the foregoing is directed to the illustrative embodiment of the present invention, other and further embodiments of the invention may be devised without departing from the basic scope thereof, and the scope thereof is determined by the claims that follow.

What is claimed is:

1. A method of controlling characteristics of a plasma in a semiconductor substrate etch processing chamber using a dual frequency RF source, comprising:
   supplying a first RF signal to a first electrode disposed in an etch chamber, wherein the first electrode is disposed beneath a substrate support surface in the etch chamber; and
   supplying a second RF signal to the first electrode, wherein an interaction between the first and second RF signals is used to control at least one characteristic of a plasma formed in the etch chamber.

2. The method of claim 1, wherein the plasma characteristic is at least sheath modulation.

3. The method of claim 2, wherein the first and second RF signals are of a low enough frequency to provide a strong self-biasing sheath in the plasma.

4. The method of claim 2, wherein the first RF signal provides a broad ion energy distribution and the second RF signal provides a peaked, well defined ion energy distribution.

5. The method of claim 4, wherein the first RF signal has a cycle time that is larger than the transit time of an ion in the sheath, and wherein the second RF signal has a period that is nearly equal to or greater than the transit time of an ion in the sheath.

6. The method of claim 2, wherein the combined applied voltage of the first and second RF signal is used to control a peak-to-peak sheath voltage and a self-biased DC potential.

7. The method of claim 6, wherein the interaction between the first and second RF signals is a ratio of their applied power.

8. The method of claim 7, wherein the ratio is used to tune the energy distribution about an average acceleration generated by the DC potential.

9. The method of claim 1, further comprising:
   supplying a third RF signal to a second electrode to form the plasma.

10. The method of claim 1, wherein the plasma characteristic is at least a power distribution within the plasma.

11. The method of claim 10, wherein the first and second RF signals provide similar plasma excitation properties and different spatial uniformity profiles.

12. The method of claim 11, wherein the interaction between the first and second RF signals is a varying effect on the power distribution in the plasma.

13. The method of claim 12, wherein the first and the second RF signals are selected such that a combined effect of the first and second RF signals produces a substantially flat power distribution.

14. The method of claim 12, wherein the interaction between the first and second RF signals is used to control the uniformity of a plasma enhanced etch process.

15. The method of claim 1, wherein the first RF signal has a frequency of about 2 MHz and the second RF signal has a frequency of about 13.56 MHz.

16. The method of claim 1, wherein the electrode is a cathode.

17. The method of claim 1, further comprising:
   etching a substrate disposed on the substrate support surface.

18. A method of controlling characteristics of a plasma in a semiconductor substrate etch chamber using a dual frequency RF source, comprising:
   determining a desired energy distribution of the plasma; and
   producing the desired energy distribution through a controlled interaction between a first and a second RF signal applied to a first electrode disposed in an etch chamber, wherein the first electrode is disposed beneath a substrate support surface in the etch chamber.

19. The method of claim 18, wherein the producing step further comprises:
   supplying the first RF signal at a first power level; and
   supplying the second RF signal at a second power level, the second power level at a predetermined ratio of the first RF signal.

20. The method of claim 18, wherein the first RF signal has a frequency of about 2 MHz and the second RF signal has a frequency of about 13.56 MHz.

21. The method of claim 18, further comprising:
   etching a substrate disposed on the substrate support surface.

22. A method of controlling characteristics of a plasma in a semiconductor substrate etch chamber using a dual frequency RF source, comprising:
   supplying a first RF signal at a first power level to a first electrode disposed in an etch chamber, wherein the first electrode is disposed beneath a substrate support surface in the etch chamber; and
   controlling the application of a second RF signal at a second power level to the first electrode to produce a desired power distribution in the plasma.

23. The method of claim 22, wherein the desired power distribution is substantially flat.

24. The method of claim 22, further comprising:
   etching a substrate using the plasma having the desired power distribution.

25. The method of claim 22, further comprising:
   etching a substrate disposed on the substrate support surface.

26. A method of controlling characteristics of a plasma in a semiconductor substrate etch processing chamber using a dual frequency RF source, comprising:

supplying a first RF signal to a first electrode disposed in an etch chamber; and supplying a second RF signal to the first electrode, wherein an interaction between the first and second RF signals is used to control at least one characteristic of a plasma formed in the etch chamber, wherein the plasma characteristic is at least a power distribution within the plasma, wherein the first and second RF signals provide similar plasma excitation properties and different spatial uniformity profiles, wherein the interaction between the first and second RF signals is a varying effect on the power distribution in the plasma, and wherein the first and the second RF signals are selected such that a combined effect of the first and second RF signals produces a substantially flat power distribution.

27. A method of controlling characteristics of a plasma in a semiconductor substrate etch chamber using a dual frequency RF source, comprising:

supplying a first RF signal at a first power level to a first electrode disposed in an etch chamber; and controlling the application of a second RF signal at a second power level to the first electrode to produce a desired power distribution in the plasma, wherein the desired power distribution is substantially flat.

* * * * *